United States Patent
Yamazaki et al.

[11] Patent Number: 5,847,413
[45] Date of Patent: Dec. 8, 1998

[54] DIFFERENTIAL AMPLIFIER CIRCUIT AND ANALOG BUFFER

[75] Inventors: Shunpei Yamazaki, Tokyo; Jun Koyama; Yasushi Ogata, both of Kanagawa, all of Japan

[73] Assignee: Semiconductor Energy Laboratory Co., Ltd., Japan

[21] Appl. No.: 520,078

[22] Filed: Aug. 28, 1995

[30] Foreign Application Priority Data

Aug. 31, 1994 [JP] Japan ................................ 6-232413
Oct. 7, 1994 [JP] Japan ................................ 6-270563

[51] Int. Cl.$^6$ .................................................. H01L 29/04
[52] U.S. Cl. .......................... 257/69; 257/72; 257/347; 257/351
[58] Field of Search .................. 257/59, 72, 350, 257/353, 69, 347, 351; 359/59

[56] References Cited

U.S. PATENT DOCUMENTS

| | | | |
|---|---|---|---|
| 5,147,826 | 9/1992 | Liu et al. ............................. | 437/233 |
| 5,275,851 | 1/1994 | Fonash et al. ....................... | 427/578 |
| 5,414,283 | 5/1995 | Den Boer et al. ................... | 257/59 |

OTHER PUBLICATIONS

C. Hayzelden et al., "In Situ Transmission Electron Microscopy Studies of Silicide–Mediated Crystallization of Amorphous Silicon"(3 pages), J. Appl. Phys. 73 (12), 1993.

T. Hempel et al., "Needle–Like Crystallization of Ni Doped Amorphous Silicon Thin Films", *Solid State Communication*, vol. 85, No. 11, pp. 921–924, 1993.

R. Kakkad et al., "Crystallized Si films by low–temperature rapid thermal annealing of amorphous silicon," *J. Appl. Phys.*, 65(5), Mar. 1, 1989, pp. 2069–2072.

G. Liu et al., "Polycrystalline silicon thin film transistors on Corning 7059 glass substrates using short time, low–temperature processing," *Appl. Phys. Lett.* 62(20), May 17, 1993, pp. 2554–2556.

G. Liu et al., "Selective area crystallization of amorphous silicon films by low–temperature rapid thermal annealing," *Appl. Phys. Lett.* 55(7), Aug. 14, 1989, pp. 660–662.

R. Kakkad et al., "Low Temperature Selective Crystallization of Amorphous Silicon," *Journal of Non–Crystalline Solids*, 115, 1989, pp. 66–68.

Primary Examiner—Minh-Loan Tran
Attorney, Agent, or Firm—Sixbey, Friedman, Leedom & Ferguson; Gerald J. Ferguson, Jr.; Jeffrey L. Costellia

[57] ABSTRACT

By forming a gate electrode, a source electrode and a drain electrode so as to assume concentric circles on an active layer made of, for instance, a crystalline silicon thin film, it is prevented that an edge of the active layer is located on a line connecting the source and drain electrodes. This configuration prevents the source and drain electrodes from being short-circuited by the gate electrode, resulting in reduction of a leak current. Specifically, a channel region may surround one the source and drain region while the other of the source and drain region surrounds the channel region. Alternatively, the gate electrode may surround one the source and drain region while the other of the source and drain region surrounds the channel region.

40 Claims, 12 Drawing Sheets

DIFFERENTIAL AMPLIFIER CIRCUIT AND ANALOG BUFFER

BACKGROUND OF THE INVENTION

1. Field of the Invention

The present invention relates to an electro-optical device such as a liquid crystal display device and, more specifically, to a liquid crystal display device in which an active matrix circuit is constituted of thin-film transistors.

2. Description of the Related Art

At present, the CRT is mainly used as a display device. While the CRT has various advantages such as high contrast and high resolution, it is disadvantageous in that a heavy container is needed to sustain the vacuum and that the depth dimension is large because of the use of a single electron gun. The liquid crystal display has been developed as one of new display devices to solve the above problems.

The liquid crystal display is lighter and thinner than the CRT. However, the simple matrix drive scheme, which was employed in the initial development stage, could not provide sufficiently high contrast. The scheme that uses an active matrix circuit to drive a liquid crystal display now attracts much attention.

In the active matrix circuit, a capacitor is formed by interposing a liquid crystal between a pixel electrode and an opposing electrode, and charge input to and output from the capacitor is controlled by thin-film transistors (hereinafter abbreviated as TFTs). To display images stably, it is required that the voltage between the two electrodes be kept constant.

However, for several reasons, it is difficult to display images stably. The biggest problem is that charge leaks through the TFTs even while they are in an off state. Although charge also leaks from the capacitor itself, in general, the amount of charge leakage due to this phenomenon is only about $1/10$ of that through the TFTs. Where the charge leakage is very large, a phenomenon called a flicker occurs in which the brightness of images varies at the frame frequency.

To make the charge leakage negligible, a structure has been developed in which another capacitor is formed by wiring metal layers in parallel with the capacitor in which the liquid crystal is incorporated. However, this structure has various problems such as a reduced pixel opening ratio (a reduced pixel aperture ratio), an increased capacitor charging time, and a slowed operation speed.

In recent years, there is a tendency in manufacture that liquid crystal driving circuits are formed on the same substrate as TFTs that constitute pixels by using the active matrix circuit manufacturing technology. In this case, in addition to a pixel matrix, a signal line driving circuit and a scanning line driving circuit are constituted of TFTs.

Figure 1:
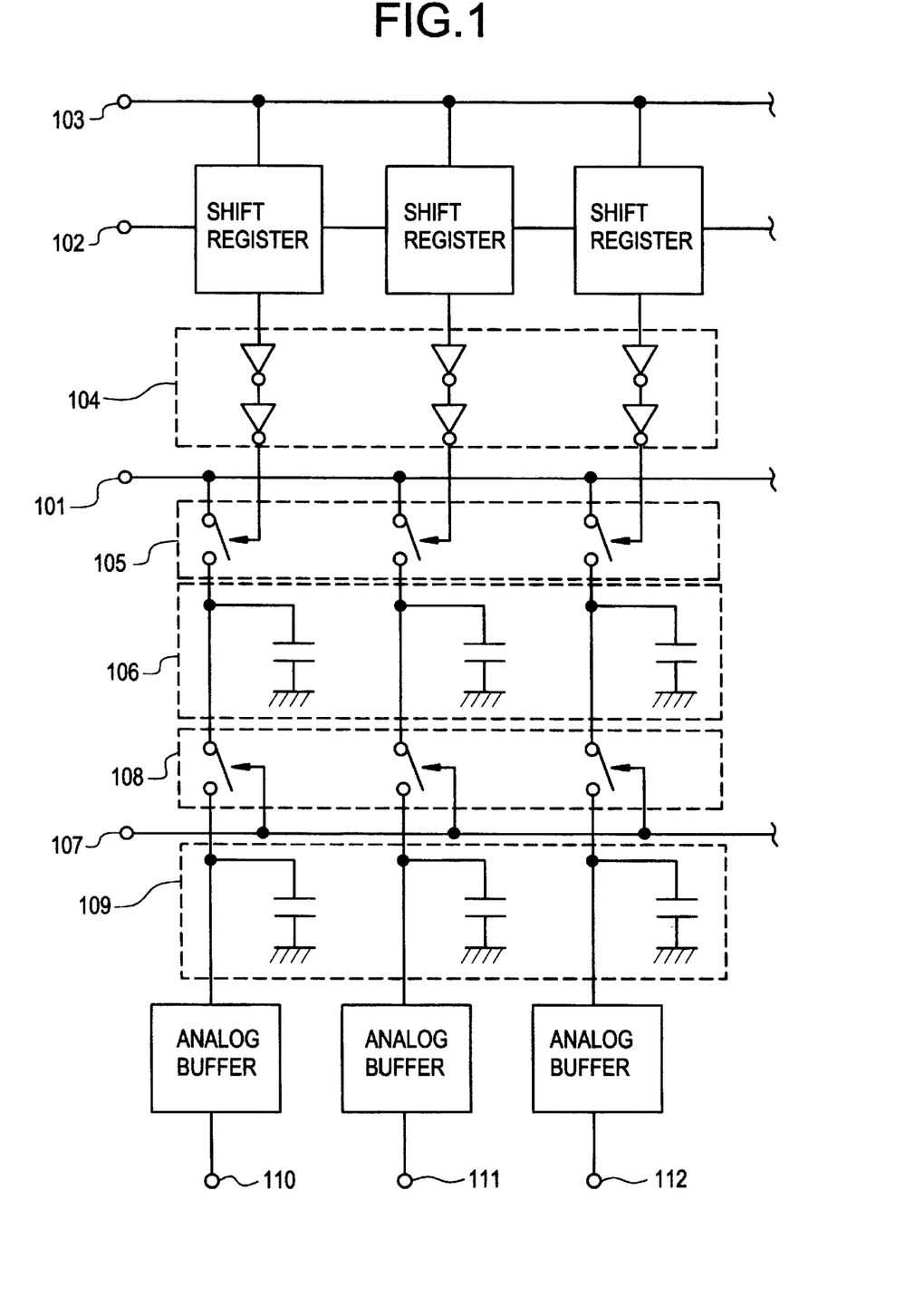
FIG. 1 is a block diagram showing a signal line scanning circuit.

FIG. 1 shows a configuration of a line-sequential scanning type signal line driving circuit, which consists of a shift register circuit, a sampling circuit, a transfer circuit, and an analog buffer circuit. A start pulse that is synchronized with a video signal (reference numeral 101 denotes a video signal line) is input to an input terminal 102 of the shift register circuit, and sequentially shifted in response to clock pulses 103. An output of the shift register circuit is input to the sampling circuit via the inverter-type buffer circuit 104.

The sampling circuit is composed of switches 105 called transmission gates and holding capacitors 106. The transmission gates are on/off-controlled by the buffer circuit 104. In an on state, the transmission gates connect the video signal line 101 to the holding capacitors 106, so that charge is stored into the holding capacitors 106. Upon passage of a start pulse through the shift register circuit, outputs of the buffer circuit 104 are inverted and the switches 105 are turned off. The charge of the holding capacitors 106 is held as it is, and the potential is maintained until the switches 105 are turned on next time.

A transfer signal is input to a transfer signal input terminal 107 between the end of sampling of one line and the start of sampling of the next line. In response, the switches 108 are turned on, to thereby connect the holding capacitors 106 to respective holding capacitors 109 for holding input potentials of analog buffers. Thus, charge transfer is effected. If the capacitance of the holding capacitors 106 is sufficiently larger than that of the holding capacitors 109, a potential variation due to this short-circuiting is small. The analog buffers are connected to the respective holding capacitors 109. Signal lines 110–112 are driven via the respective analog buffers. The analog buffer circuit is necessary to drive the signal lines 110–112 without influencing the input-side potentials.

If the TFTs have a large leak current, the potentials of the holding capacitors cannot be maintained, thus deteriorating the image quality. Further, leak currents of the TFTs become noise sources in the analog buffers.

To improve the characteristics of the TFTs used in the active matrix circuit, the techniques of crystallizing the active layer of a semiconductor film are employed. Such techniques include solid-phase growth by heating or laser light illumination.

SUMMARY OF THE INVENTION

However, the crystallization by heating or laser light illumination cannot provide semiconductor films superior in crystallinity. Therefore, the present inventors propose a method of crystallizing a semiconductor film with addition of a catalyst element thereto. According to this method, the crystallization barrier energy is reduced by the catalyzing effect and the crystal growth in the active layer of a semiconductor film proceeds continuously, to produce a structure substantially regarded as a single crystal. A semiconductor film that can be substantially regarded as a single crystal is suited to use for TFTs, diodes, and resistors.

However, in this crystallization method, since the catalyst element moves in the crystal growth direction, its concentration becomes high at a portion where it was firstly introduced and at a portion where the crystal growth ends. Considering the required time for crystallization, it is understood that the catalyst element exists in and in the vicinity of a channel region. However, a catalyst element existing in a channel portion that should be an intrinsic semiconductor deteriorates the characteristics of a TFT. In view of this fact, the inventors propose a crystallization method of controlling the crystal growth direction by selectively introducing a catalyst.

As described above, if the TFT leak current is reduced, images can be displayed stably without connecting a capacitor to the liquid crystal in parallel. The reduction of the TFT leak current is also effective in improving the image quality in the case where the driving circuits for the liquid crystal are formed on the same substrate as the TFTs constituting pixels.

A description will be made on a source of generating a leak current. For example, a pixel of an active matrix circuit has a structure shown in FIG. 2. A metal wiring line 201 constitutes a gate electrode and a wiring line. A metal wiring line 202 is connected to a source electrode. Reference numeral 203 denotes an active layer of a semiconductor film. A transparent electrode 204 serves as one of the two electrodes of a capacitor between which a liquid crystal is interposed. Reference numeral 205 denotes contact holes.

Figure 2:
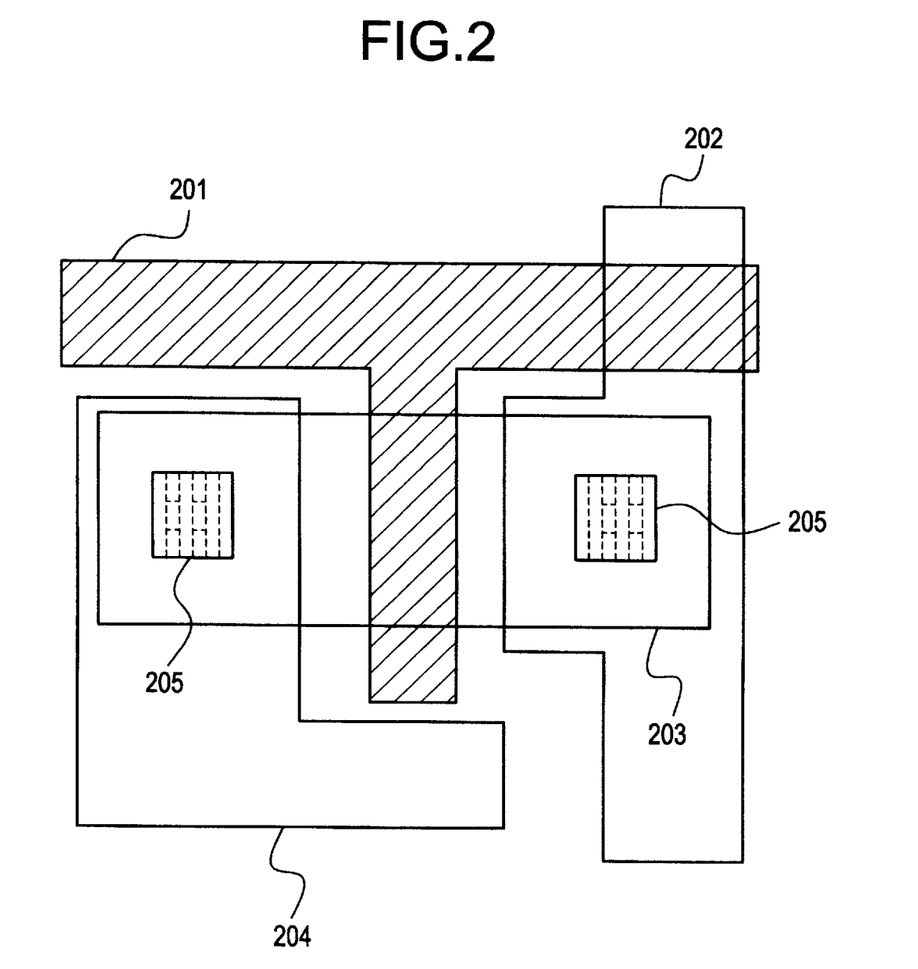
FIG. 2 is a plan view showing a configuration of a conventional TFT.
Figure 3:
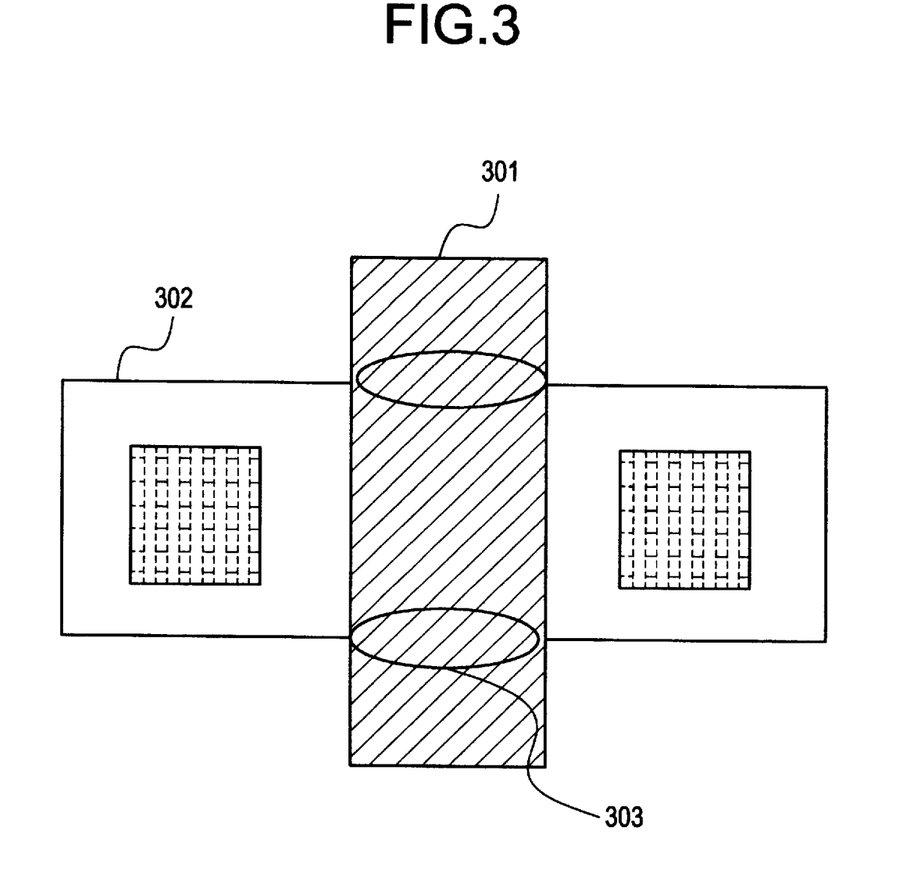
FIG. 3 is a part of FIG. 2 and illustrates sites where a leak current occurs.

FIG. 3 is an enlarged view of the TFT portion of FIG. 2. Reference numerals 301 and 302 denote the gate electrode and the active layer of the semiconductor film, respectively. It is known that a leak current occurs at edges 303. There are two reasons that cause a leak current at the edges. First, due to an insulation defect of the gate electrode, the gate electrode may short-circuit the source and drain electrodes. Second, a peripheral portion of the active layer of the semiconductor film may not have a crystal structure due to etching or ion doping damage. A description will be made on the short-circuiting by the gate electrode.

Figure 4A:
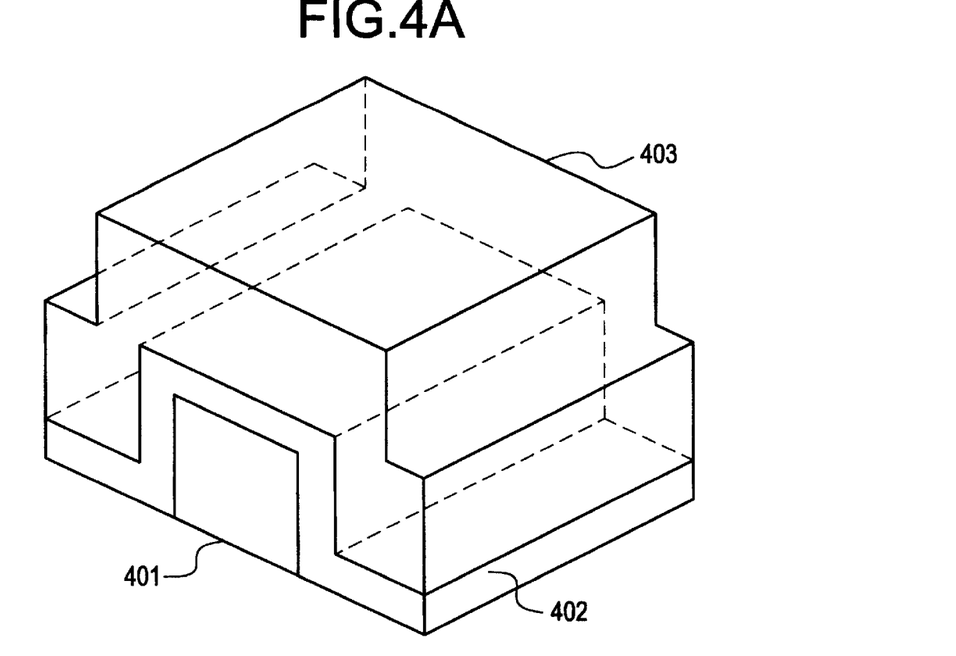
FIGS. 4a and 4b illustrate a leak current generation mechanism.

FIG. 4a shows a case where an active layer 401 of a semiconductor film is completely covered with a gate insulating film 402. When a voltage lower than the threshold voltage is applied to a gate electrode 403, almost no current flows because the active layer 401 of the semiconductor film has a high resistivity in a state that a channel is not formed. Therefore, no current flows between a drain electrode (viewer's side, for instance) and a source electrode (opposite side, for instance).

Figure 4B:
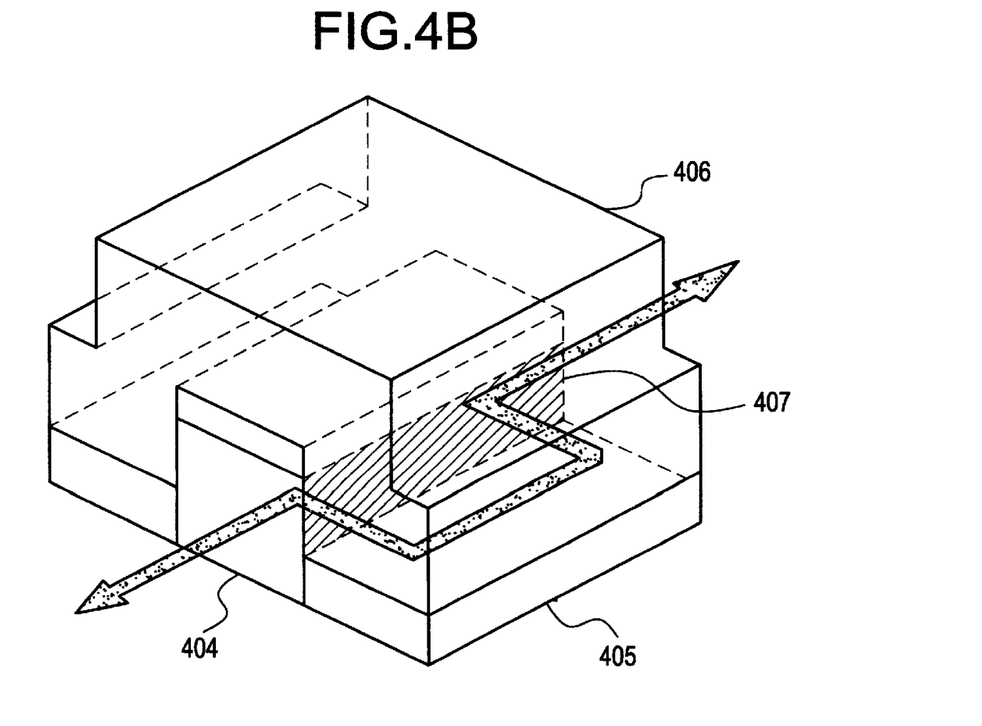

On the other hand, FIG. 4b shows a case where an active layer 404 of a semiconductor film is not completely covered with a gate insulating film 405. When the insulating film 405 is formed on the surface of the active layer 404 of the semiconductor film to insulate it from the gate electrode 406, the insulating film 405 is hard to be formed on side faces 407 and, therefore, the side face 407 is sometimes left exposed. In this state, the gate electrode 406 and the active layer 404 of the semiconductor film are short-circuited at the side face 407. As a result, when a voltage lower than the threshold voltage is applied, the drain electrode and the source electrode are always short-circuited by the gate electrode 406 even in a state that a channel is not formed. That is, a leak current occurs even in an off state.

In general, in a manufacturing process, a thin film is hard to be formed on the side face of a step portion of an active layer. Therefore, it likely occurs that the side face 407 of the active layer 404 is not completely covered with the insulating film 405 as shown in FIG. 4b. That is, a leak current flows through the edges 303 shown in FIG. 3. This means that the leak current can be reduced if the structure of a TFT does not have edge portions like the edges 303 in FIG. 3.

An object of the present invention is to provide a method for preventing a manufacturing process from generating a source of a leak current by providing a proper plan configuration of a TFT.

Another object of the present invention is to provide a method of preventing a source of a leak current by providing a proper plan configuration of a TFT which can also be applied to a case where an active layer is crystallized with selective addition of a catalyst.

To attain the above objects, the present invention reduces a leak current by a configuration in which edges of an active layer of a semiconductor film are not located on lines connecting source and drain electrodes. A specific plan configuration of a TFT is shown in FIG. 5a.

Figure 5A:
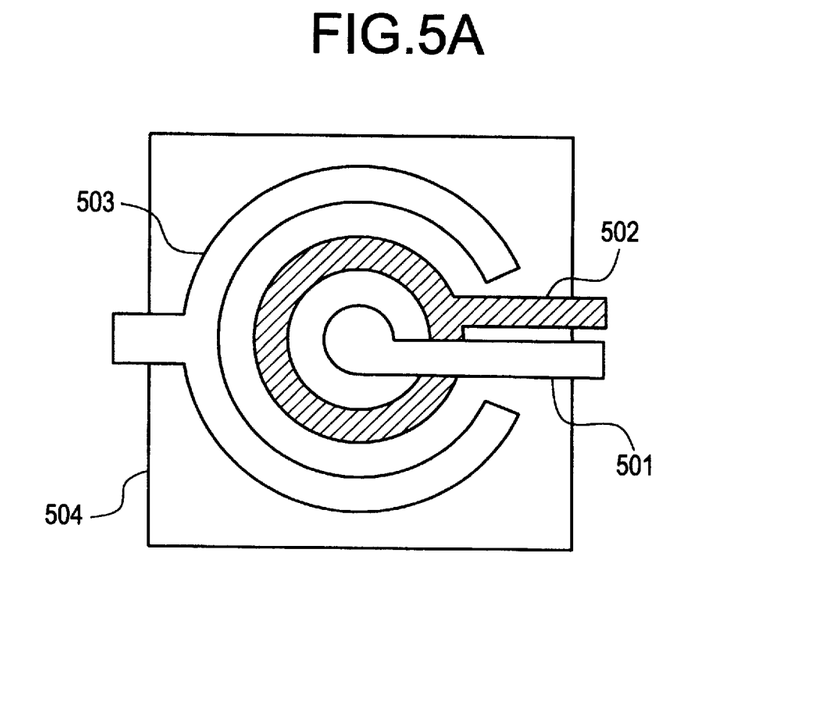
FIGS. 5a and 5b show configurations of TFTs according to Embodiment 1 of the present invention.

Referring to FIG. 5a, a gate electrode 502 and electrodes 501 and 503 are so provided that the center of an active layer 504 that is, for instance, a crystalline silicon thin film is the center of symmetry of the gate electrode 502 and the electrodes 501 and 503. One of the electrodes 501 and 503 is used as a source electrode and the other is used as a drain electrode. With this configuration, edges of the active layer 504 are not located on lines connecting the source and drain electrodes. Therefore, the source electrode and the drain electrode are not short-circuited by the gate electrode 502, so that the leak current can be reduced.

DETAILED DESCRIPTION OF THE PREFERRED EMBODIMENTS

Embodiment 1

Figure 5B:
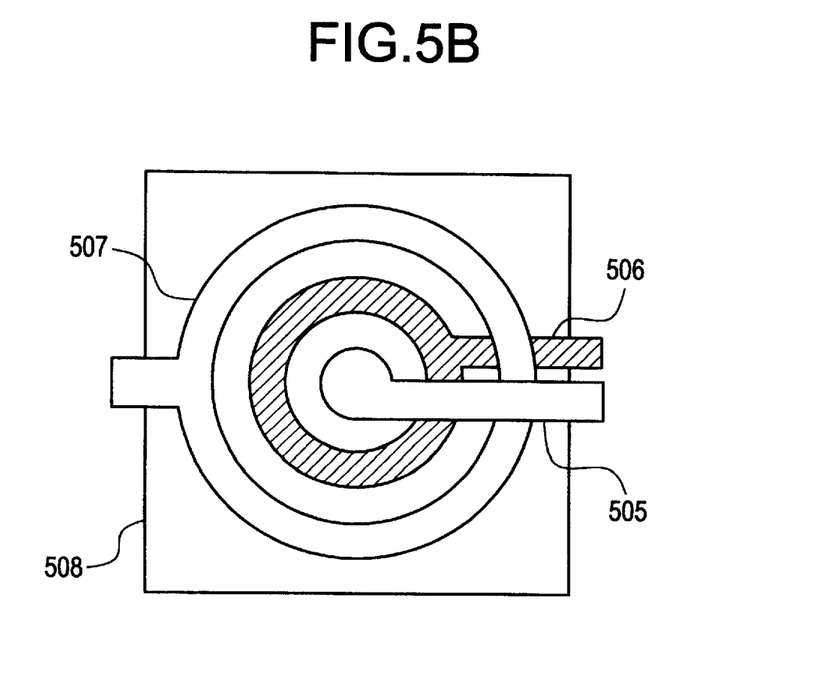

FIGS. 5a and 5b show plan configurations of TFTs according to Embodiment 1.

The TFT configuration of FIG. 5a is characterized in that electrodes are so arranged as to assume concentric circles, and that an electrode to become a drain or source electrode is completely surrounded by a gate electrode. A gate electrode 502 is provided around a circular electrode 501. Since the electrode 501 belongs to a layer different than a metal wiring line that constitutes the gate electrode 502, it may overlap with the gate electrode 502. Further, an electrode 503 is provided outside the gate electrode 502. The electrodes 501 and 503 are constituted of metal wiring lines belonging to the same layer. Therefore, to avoid short-circuiting, the electrode 503 assumes a circle having a cut. One of the electrodes 501 and 503 may be used as a source electrode and the other may be used as a drain electrode.

An active layer 504 of a semiconductor film assumes a shape as shown in FIG. 5a. The metal wiring line constituting the gate electrode 502 has a portion that crosses an edge of the active layer 504 of the semiconductor film. However, this causes no problem because both sides of the edge of the active layer 504 that might be short-circuited are at the same electrical potential.

When the TFT of this embodiment is used, for instance, as a pixel TFT, a protection film may be formed after the TFT and the wiring lines are formed, and then the electrodes may be formed as a transparent conductor. Referring to FIG. 5a, a pixel TFT can be formed in the following manner. That is, the electrode 501, the gate electrode 502 and the electrode 503 are so formed as to belong to different layers. The electrode 501 serving as a drain electrode is formed as a transparent conductor, and the electrode 503 serving as a source electrode is formed as a metal wiring line. This configuration can reduce not only a leak current but also wiring capacitances of the gate electrode 502 and the electrode 501 as the drain electrode.

No short-circuiting occurs in the case where the gate electrode, the metal wiring line and the transparent conductor are so formed as to belong to different layers, i.e., as to assume three-layer metal wiring lines and wiring capacitances can be neglected. In this case, a TFT that does not have a cut in any electrode as shown in FIG. 5b may be formed. A ring-shaped gate electrode 506 is formed around a circular electrode 505 substantially in a concentric manner, and a ring-shaped electrode 507 is formed outside the gate electrode 506. Since the electrodes 505 and 507 are formed in different layers, the electrode 507 does not have a cut. One of the electrodes 505 and 507 may be used as a source electrode and the other may be used as a drain electrode. In particular, if a TFT having a structure in which the electrode 507 serving as a source electrode is formed as a metal wiring line and the electrode 505 serving as a drain electrode is formed as a transparent conductor is used as a pixel TFT, the leak current can be reduced effectively.

The reduction of a leak current is effective in holding charge in a positive manner in a structure in which a TFT is used as a charge control switch and charge is stored in a capacitor. If the loss of charge is lowered, the capacitance can be reduced to a level corresponding to an allowable potential variation, enabling area reduction and fine processing. Where the electrode 502 is used as a source electrode and the electrode 503 is used as a drain electrode, the contact area between the drain region and the channel forming region can be made larger than that between the source region and the channel forming region. Therefore, the drain-channel electric field strength can be reduced substantially. This provides an advantages of a reduced leak current as in the case of employing a LDD structure.

Embodiment 2

Figure 6A:
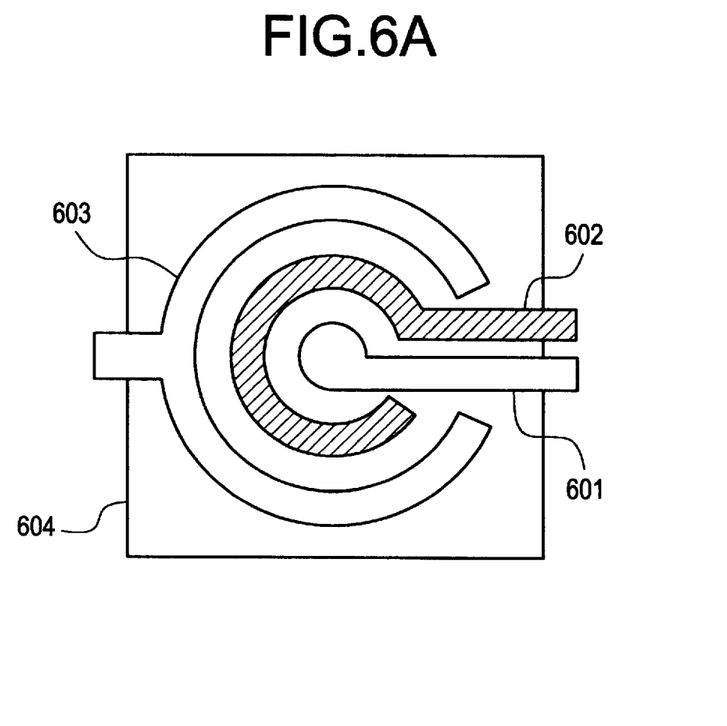
FIGS. 6a and 6b show configurations of TFTs according to Embodiment 2 of the invention.
Figure 6B:
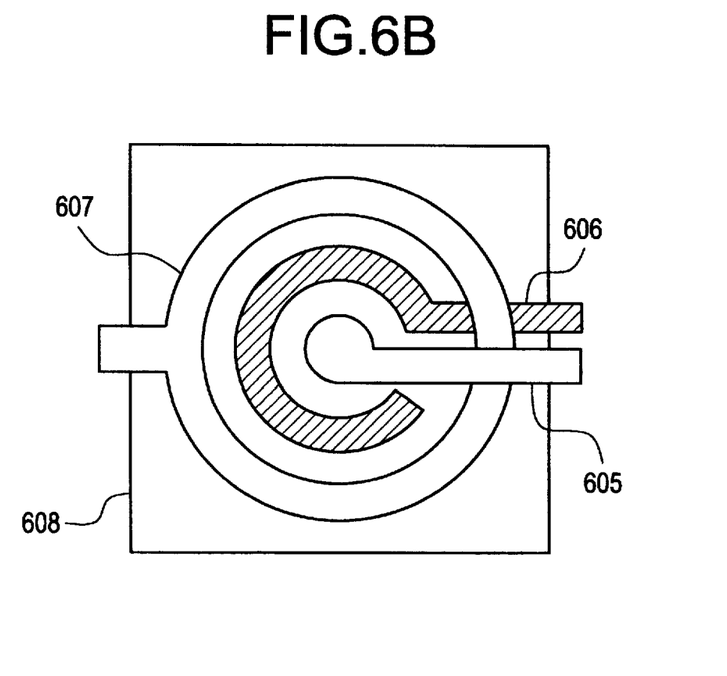

FIGS. 6a and 6b show plan configurations of TFTs according to Embodiment 2, which are characterized by a concentric arrangement.

In FIG. 6a, a ring-shaped gate electrode 602 is formed around a circular electrode 601. Although the electrode 601 is formed in a layer different than a metal wiring line constituting the gate electrode 602, a capacitor is formed if they overlap with each other. To avoid formation of such a capacitor, the gate electrode 602 is prevented from overlapping with the electrode 601 by forming a cut in the ring portion of the gate electrode 602. While Embodiment 1 is used when such a capacitor is negligible, this embodiment is used when it is not.

Further, a ring-shaped electrode 603 is formed outside the gate electrode 602. The electrodes 601 and 603 are constituted of metal wiring lines that belong to the same layer. Therefore, to avoid short-circuiting, a cut is formed in the ring portion of the electrode 603. An active layer 604 of a semiconductor film assumes a shape as shown in FIG. 6a. One of the electrodes 601 and 603 may be used as a source electrode and the other may be used as a drain electrode.

As shown in FIG. 6a, the metal wiring line constituting the gate electrode 602 has a portion that crosses an edge of the active layer 604 of the semiconductor film. However, this causes no problem because both sides of the edge of the active layer 604 that might be short-circuited are at the same electrical potential.

When the TFT of this embodiment is used, for instance, as a pixel TFT, a protection film may be formed after the TFT and the wiring lines are formed, and then the electrodes may be formed as a transparent conductor. Referring to FIG. 6a, a pixel TFT can also be formed in the following manner. That is, the electrode 601 serving as a drain electrode is formed as a transparent conductor, and the electrode 603 serving as a source electrode is formed as a metal wiring line. Further, the electrode 601, the gate electrode 602 and the electrode 603 are formed in different layers. This configuration can reduce not only a leak current but also wiring capacitances of the gate electrode 602 and the electrode 601 as the drain electrode.

Where three-layer metal wiring lines can be formed in the above manner and wiring capacitances can be neglected, a TFT as shown in FIG. 6b may be formed. A ring-shaped gate electrode 606 is formed around a circular electrode 605 substantially in a concentric manner, and a ring-shaped electrode 607 is formed outside the gate electrode 606. Since the electrodes 605 and 607 are formed in different layers, the electrode 607 does not have a cut. One of the electrodes 605 and 607 may be used as the source electrode and the other may be used as a drain electrode. In particular, if a TFT having a structure in which the electrode 607 serving as a source electrode is formed as a metal wiring line and the electrode 605 serving as a drain electrode is formed as a transparent conductor is used as a pixel electrode, the leak current can be reduced effectively.

A consideration will be made on doping impurities into the active layer. If impurities are doped with the gate electrode 602 having the very shape of FIG. 6a used as a mask, the drain and source electrodes are short-circuited through the doped active layer 604 of the semiconductor film. Therefore, some modification is needed such as adding, to the mask, a pattern for separating the active layer 604 of the semiconductor layer into a drain region and a source region.

As shown in FIGS. 5a and 5b and FIGS. 6a and 6b, in Embodiments 1 and 2, the electrodes are approximately similar in outer shape and are arranged concentrically. Therefore, a ring-shaped channel region is to be formed in the active layer of the semiconductor film so as to be concentric with the electrodes. A method of forming such a channel region will be described with reference to FIGS. 7a and 7b. The following description is directed to the case where crystal growth is effected with selective addition, to the active layer, of a catalyst element for accelerating crystallization.

Figure 7A:
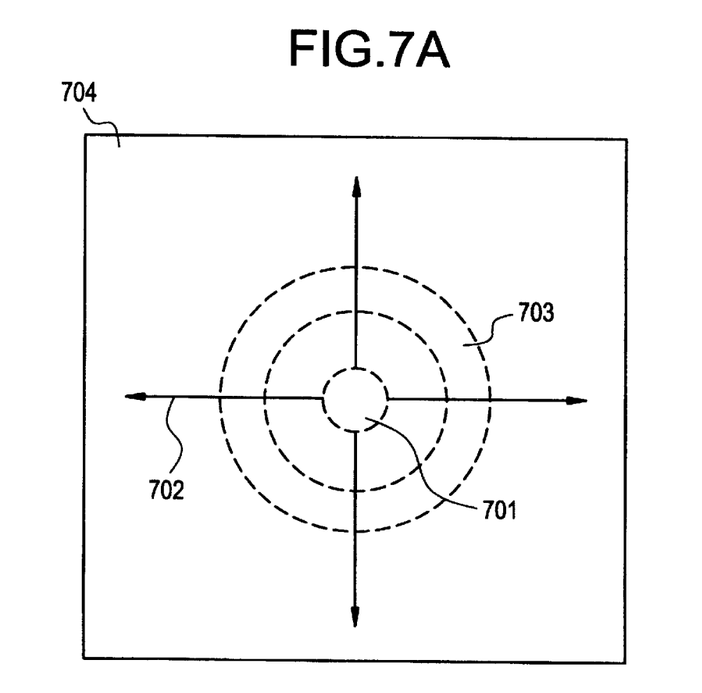
FIGS. 7a and 7b illustrate crystallization processes using a catalyst for the TFTs of Embodiments 1 and 2.

FIG. 7a shows a case where a catalyst-added region 701 is provided at a central portion of an island-like region 704 that is formed by etching an active layer of a semiconductor film and crystal growth proceeds outwardly in the radial directions of the concentric circles as indicated by arrows 702 in the figure.

As a result of the crystal growth indicated by arrows 702, the catalyst element comes to exist at a high concentration at both beginning and end portions of the crystal growth. Therefore, a channel region needs to be so formed as to avoid those portions. More specifically, a region 703 to become a channel is formed approximately at the middle of the beginning and end portions of the crystal growth so as to have its center of symmetry at the center of the island-like region 704 and as to be approximately similar in shape to the electrodes shown in FIGS. 5a and 5b, and FIGS. 6a and 6b.

Figure 7B:
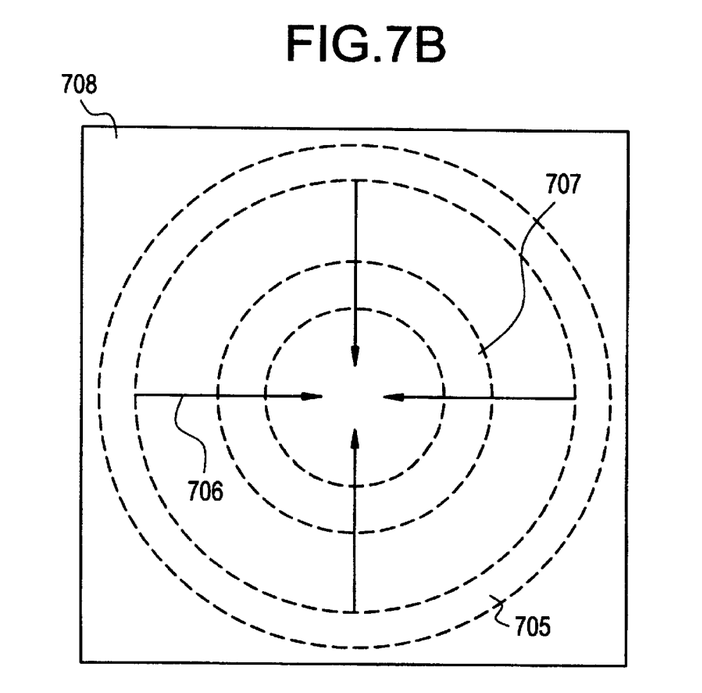

On the other hand, FIG. 7b shows a case where the crystal growth is effected from the periphery to the center of an island-like region 708 that is formed by etching an active layer of a semiconductor film. A catalyst element for accelerating crystallization is added to a ring-shaped region 705 whose center coincides with the center of the island-like region 708. Therefore, crystal growth proceeds inwardly in the radial directions of the concentric circles of the catalyst-added region 705 as indicated by arrows 706.

As a result of the crystal growth indicated by arrows 706, the catalyst element comes to exist at a high concentration at both beginning and end portions of the crystal growth. Therefore, a channel region needs to be so formed as to avoid those portions. More specifically, a region 707 to become a channel is formed approximately at the middle of the beginning and end portions of the crystal growth so as to have its center of symmetry at the center of the island-like region 708 and as to be approximately similar in shape to the electrodes shown in FIGS. 5a and 5b, and FIGS. 6a and 6b.

Even where crystallization is effected by use of a catalyst element as shown in FIGS. 7a and 7b, the ring-shaped channel regions 703 and 707 can be so formed as to avoid the regions where the catalyst element exists at a high concentration. Therefore, the selective crystallization step using a catalyst element for accelerating crystallization can be employed in the manufacturing process of the TFT having the electrode arrangement of Embodiments 1 or 2.

Figure 8:
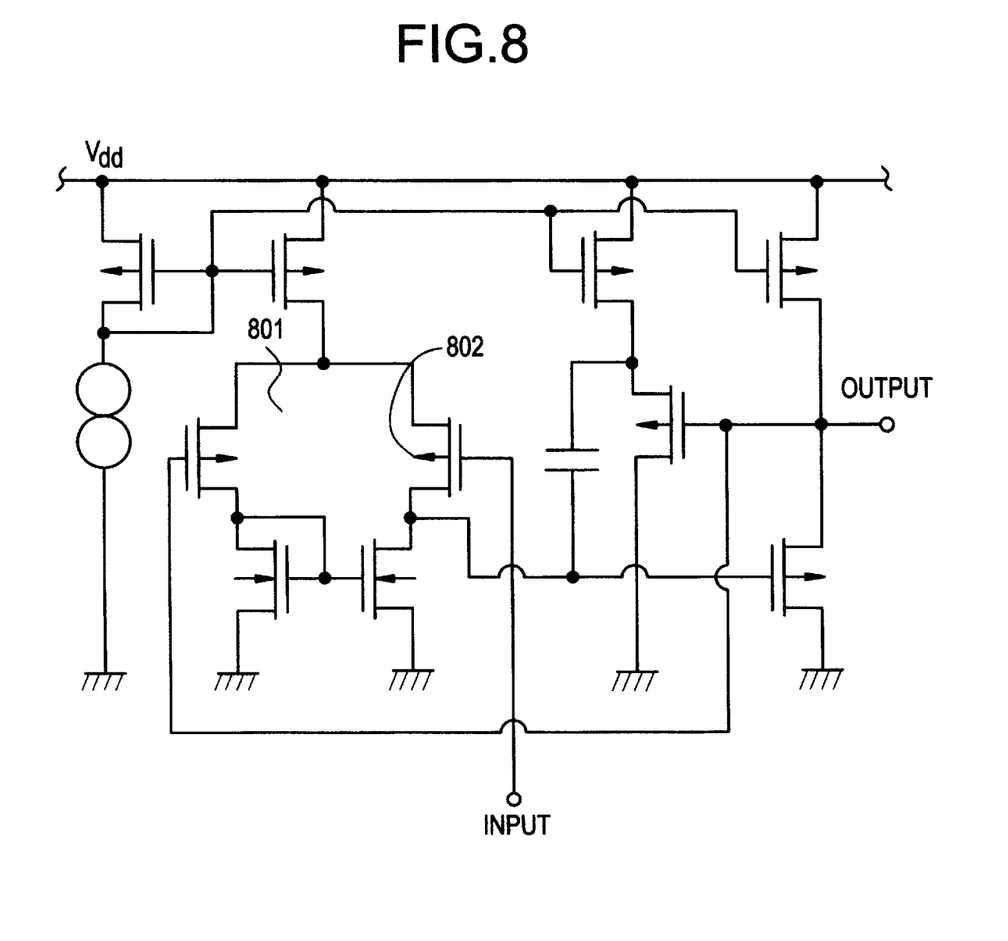
FIG. 8 is a circuit diagram showing a configuration of an analog buffer circuit.

A consideration will be made on a case where the TFT having the configuration of Embodiment 1 or 2 is used in a peripheral driving circuit that is formed on the same transparent substrate as pixel TFTs. FIG. 8 is a circuit diagram of an analog buffer circuit used in a signal line driving circuit. A large leak current in TFTs 801 and 802 in the input stage of a differential amplifier circuit becomes a noise generating source. Therefore, if the TFT having the configuration of Embodiment 1 or 2 is used as those TFTS, the performance of the analog buffer can be improved.

Figure 9:
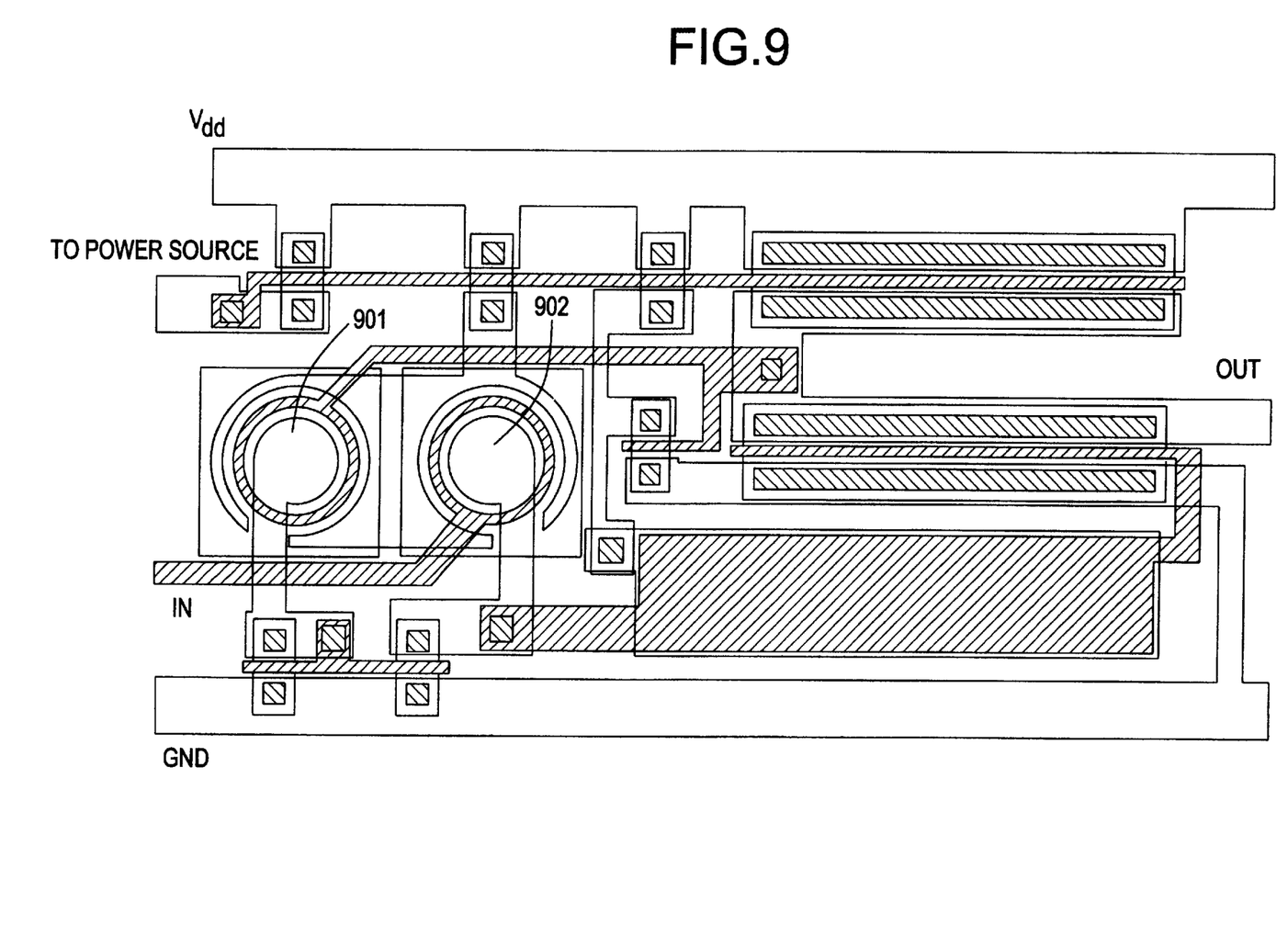
FIG. 9 shows a device arrangement of an analog buffer circuit.

FIG. 9 is a plan view showing TFT devices and wiring. Reference numerals 901 and 902 denote TFTs for noise reduction.

The reduction of a leak current is effective in positively holding charge in a configuration in which charge is stored in a capacitor with a TFT used as a charge control switch. If the loss of charge is reduced, the capacitance can be reduced to a level corresponding to an allowable potential variation, enabling area reduction and fine processing.

Embodiment 3

Figure 10A:
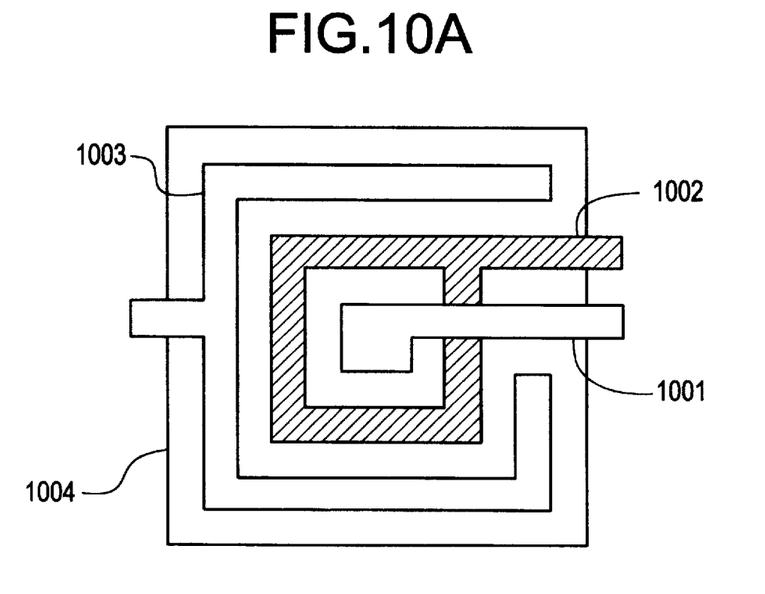
FIGS. 10a and 10b show configurations of TFTs according to Embodiment 3 of the invention.
Figure 10B:
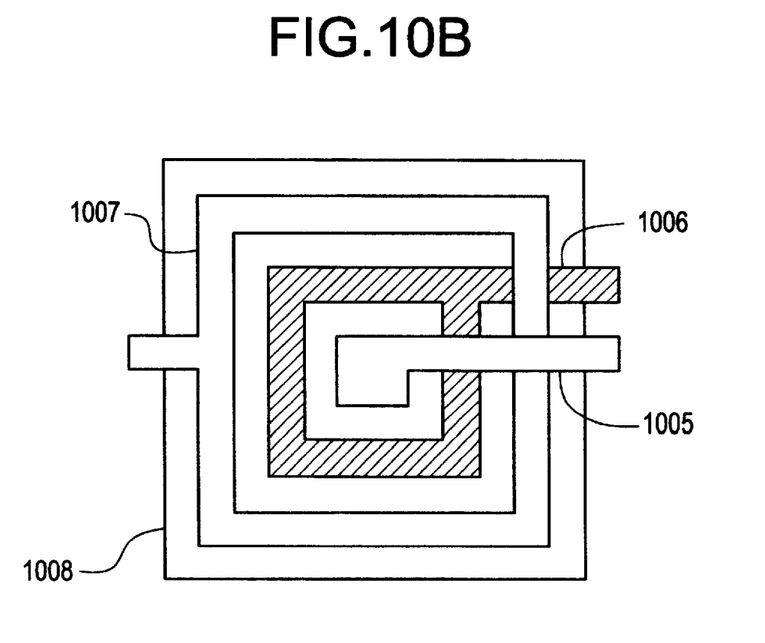

FIGS. 10a and 10b show plan configurations of TFTs according to Embodiment 3.

The TFT configuration of FIG. 10a is characterized in that an electrode to become a source or drain electrode is completely surrounded by a gate electrode 1002. The gate electrode 1002 is provided around a rectangular electrode 1001. Since the electrode 1001 belongs to a layer different than a metal wiring line that constitutes the gate electrode 1002, it may overlap with the gate electrode 1002. Further, an electrode 1003 is provided outside the gate electrode 1002. One of the electrodes 1001 and 1003 may be used as a source electrode and the other may be used as a drain electrode. The electrodes 1001 and 1003 are constituted of metal wiring lines belonging to the same layer. Therefore, to avoid short-circuiting, the electrode 1003 assumes a rectangle having a cut. Reference numeral 1004 denotes an active layer of a semiconductor film. The electrode 1001, the gate electrode 1002 and the electrode 1003 are so formed to be substantially rectangular in outer shape, and as to have their centers of symmetry at the center of the active layer 1004.

The metal wiring line constituting the gate electrode 1002 has a portion that crosses an edge of the active layer 1004 of the semiconductor film. However, this causes no problem because both sides of the edge of the active layer 1004 that might be short-circuited are at the same electrical potential.

When the TFT of this embodiment is used, for instance, as a pixel TFT, a protection film may be formed after the TFT and the wiring lines are formed, and then the electrodes may be formed as a transparent conductor. Referring to FIG. 10a, a pixel TFT can be formed in the following manner. That is, the electrode 1001, the gate electrode 1002 and the electrode 1003 are so formed as to belong to different layers. The electrode 1001 serving as a drain electrode is formed as a transparent conductor, and the electrode 1003 serving as a source electrode is formed as a metal wiring line. This configuration can reduce not only a leak current but also wiring capacitances of the gate electrode 1002 and the electrode 1001 that are used as the drain electrode.

No short-circuiting occurs in the case where three-layer metal wiring lines can be formed in the above manner and wiring capacitances can be neglected. In this case, a TFT that does not have a cut in any electrode as shown in FIG. 10b may be formed. A gate electrode 1006 is formed around a rectangular electrode 1005, and a rectangular-ring-shaped electrode 1007 is formed outside the gate electrode 1006. Since the electrodes 1005 and 1007 are formed in different layers, the electrode 1007 does not have a cut. One of the electrodes 1005 and 1007 may be used as the source electrode and the other may be used as a drain electrode. In particular, if a TFT having a structure in which the electrode 1007 serving as a source electrode is formed as a metal wiring line and the electrode 1005 serving as a drain electrode is formed as a transparent conductor is used as a pixel TFT, the leak current can be reduced effectively.

The reduction of a leak current is effective in holding charge in a positive manner in a structure in which a TFT is used as a charge control switch and charge is stored in a capacitor. If the loss of charge is lowered, the capacitance can be reduced to a level corresponding to an allowable potential variation, enabling area reduction and fine processing.

Embodiment 4

Figure 11A:
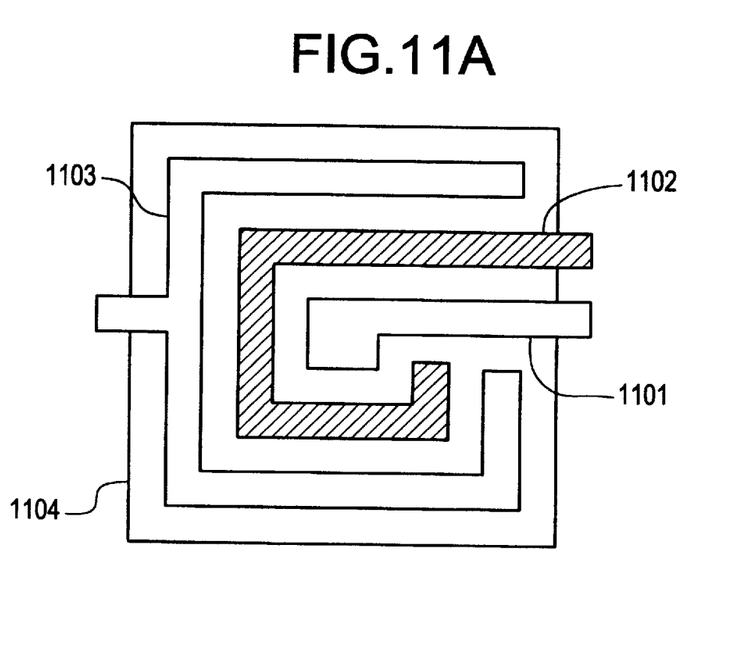
FIGS. 11a and 11b show configurations of TFTs according to Embodiment 4 of the invention.

FIG. 11a shows a plan configuration of a TFT according to Embodiment 4, which is characterized in that an electrode 1101 to become a source or drain electrode is almost completely surrounded by a gate electrode 1102. Since the electrode 1101 is formed in a layer different than a metal wiring line constituting the gate electrode 1102, a capacitor is formed if they overlap with each other. To avoid formation of such a capacitor, the gate electrode 1102 is prevented from overlapping with the electrode 1101 by forming a cut in the rectangular ring portion of the gate electrode 1102. While Embodiment 3 is used when such a capacitor is negligible, this embodiment is used when it is not.

Further, an electrode 1103 is formed outside the gate electrode 1102. The electrode 1103 may be used as either a source electrode or a drain electrode. The electrodes 1101 and 1103 are constituted of metal wiring lines that belong to the same layer. Therefore, to avoid short-circuiting, a cut is formed in the rectangular portion of the electrode 1103. An active layer 1108 of a semiconductor film assumes a shape as shown in FIG. 11a. The electrode 1101, the gate electrode 1102 and the electrode 1103 are substantially similar to each other in shape, and have their centers of symmetry at the center of the active layer 1104.

The metal wiring line constituting the gate electrode 1102 has a portion that crosses an edge of the active layer 1104 of the semiconductor film. However, this causes no problem because both sides of the edge of the active layer 1104 that might be short-circuited are at the same electrical potential.

When the TFT of this embodiment is used, for instance, as a pixel TFT, a protection film may be formed after the TFT and the wiring lines are formed, and then the electrodes may be formed as a transparent conductor. Referring to FIG. 11a, a pixel TFT can also be formed in the following manner. That is, the electrode 1101 serving as a drain electrode is formed as a transparent conductor, and the electrode 1103 serving as a source electrode is formed as a metal wiring line. Further, the electrode 1101, the gate electrode 1102 and the electrode 1103 are formed in different layers. This configuration can reduce not only a leak current but also wiring capacitances of the gate electrode 1102 and the electrode 1101 as the drain electrode.

Figure 11B:
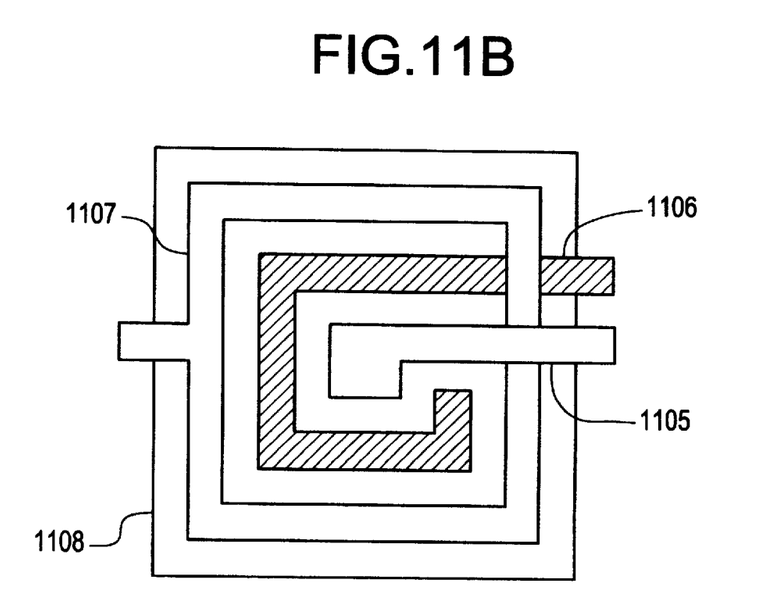

No short-circuiting occurs in the case where three-layer metal wiring lines can be formed in the above manner and wiring capacitances can be neglected. In this case, a TFT that does not have a cut in any electrode as shown in FIG. 11b may be formed. A gate electrode 1106 is formed around a rectangular electrode 1105, and a rectangular-ring-shaped electrode 1107 is formed outside the gate electrode 1106. Since the electrodes 1105 and 1107 are formed in different layers, the electrode 1107 does not have a cut.

One of the electrodes 1105 and 1107 may be used as a source electrode and the other may be used as a drain electrode. In particular, if a TFT having a structure in which the electrode 1107 serving as a source electrode is formed as a metal wiring line and the electrode 1105 serving as a drain electrode is formed as a transparent conductor is used as a pixel TFT, the leak current can be reduced effectively.

A consideration will be made on doping impurities into the active layer. If impurities are doped with the gate electrode 1102 having the very shape of FIG. 11a used as a mask, the drain and source electrodes are short-circuited through the doped active layer 1104 of the semiconductor film. Therefore, some modification is needed such as adding, to the mask, a pattern for separating the active layer 1104 of the semiconductor layer into a drain region and a source region.

As shown in FIGS. 10a and 10b and FIGS. 11a and 11b, in Embodiments 3 and 4, the electrodes are so arranged that the rectangular-ring-shaped electrodes have their centers of symmetry at the same point. Therefore, a rectangular-ring-shaped channel region is to be formed in the active layer of the semiconductor film. A method of forming such a channel region will be described with reference to FIGS. 12a and 12b. The following description is directed to the case where crystal growth is effected with selective addition, to the active layer, of a catalyst element for accelerating crystallization.

Figure 12A:
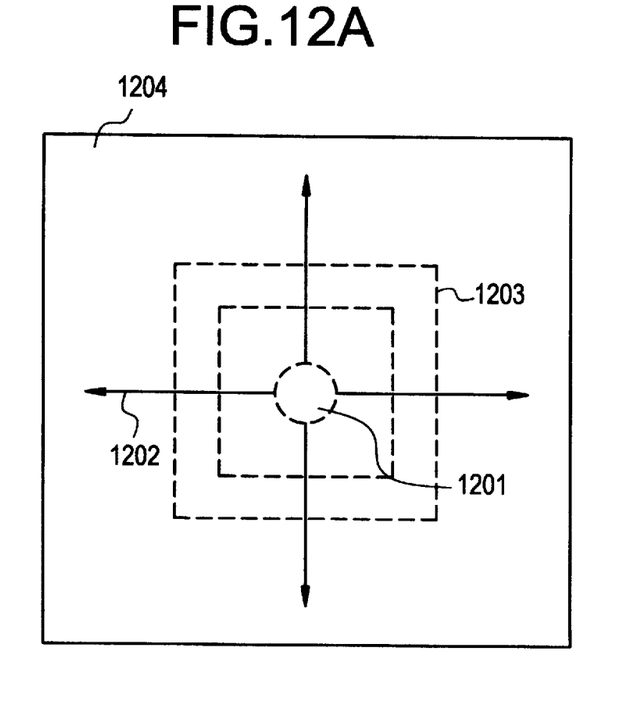
FIGS. 12a and 12b illustrate crystallization processes using a catalyst for the TFTs of Embodiments 3 and 4.

FIG. 12a shows a case where a catalyst-added region 1201 is provided at a central portion of an island-like region 1204 that is formed by etching an active layer of a semiconductor film and crystal growth proceeds outwardly, i.e., toward the periphery as indicated by arrows 1202 in the figure.

As a result of the crystal growth indicated by arrows 1202, the catalyst element comes to exist at a high concentration at both beginning and end portions of the crystal growth. Therefore, a channel region needs to be so formed as to avoid those portions. More specifically, a region 1203 to become a channel is formed approximately at the middle of the beginning and end portions of the crystal growth so as to have its center of symmetry at the center of the island-like region 1204 and as to be approximately similar in shape to the electrodes shown in FIGS. 10a and 10b and FIGS. 11a and 11b.

Figure 12B:
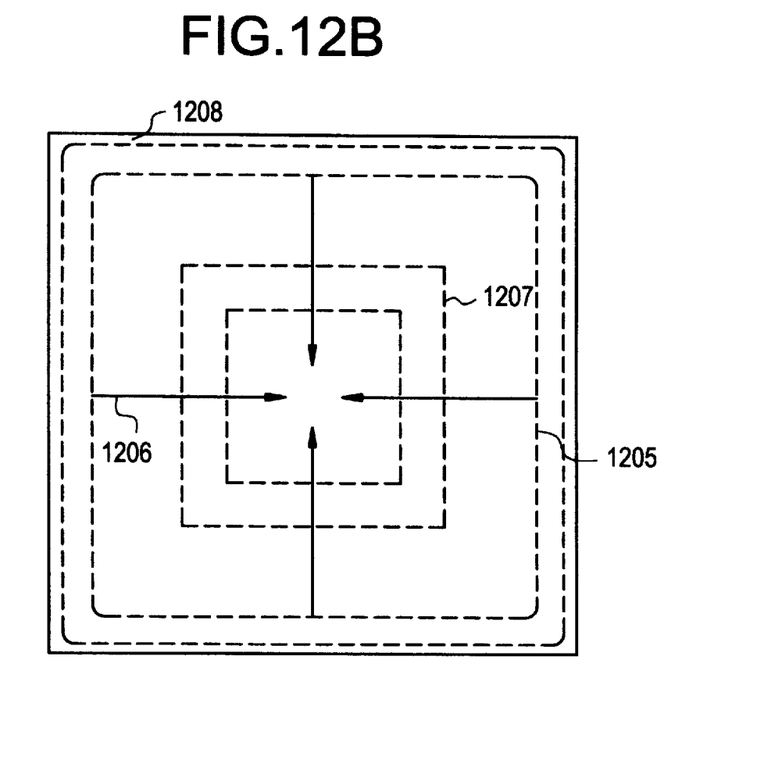

On the other hand, FIG. 12b shows a case where crystal growth is effected from the periphery to the center of an island-like region 1208 that is formed by etching an active layer of a semiconductor film. A catalyst element for accelerating crystallization is added to a rectangular-ring-shaped region 1205 whose center coincides with the center of the island-like region 1208. Therefore, crystal growth proceeds inwardly, i.e., in the direction in which the size of the similar figures is reduced as indicated by arrows 1206.

As a result of the crystal growth indicated by arrows 1206, the catalyst element comes to exist at a high concentration at both beginning and end portions of the crystal growth. Therefore, a channel region needs to be so formed as to avoid those portions. More specifically, a region 1207 to become a channel is formed approximately at the middle of the beginning and end portions of the crystal growth so as to have its center of symmetry at the center of the island-like region 1208 and as to be approximately similar in shape to the electrodes shown in FIGS. 10a and 10b, and FIGS. 11a and 11b.

Even where crystallization is effected by use of a catalyst element as shown in FIGS. 12a and 12b, the rectangular-ring-shaped channel regions 1203 and 1207 can be so formed as to avoid the regions where the catalyst element exists at a high concentration. Therefore, the selective crystallization step using a catalyst element for accelerating crystallization can be employed in the manufacturing process of the TFT having the electrode arrangement of Embodiments 1 or 2.

As described above, a leak current may occur in a configuration in which the gate electrode crosses an edge of the active layer of the semiconductor film. The present invention reduces a leak current by providing such a configuration that short-circuiting of the active layer causes no effect, more specifically, by equalizing the potentials of a portion of the edge where the gate electrode crosses. The reduction of a leak current enables the potential of a capacitor to be held more positively. If the potential is held sufficiently, a state immediately after an input can be kept as it is until the next potential updating. This prevents contrast reduction and occurrence of a flicker on a liquid crystal screen.

What is claimed is:

1. A differential amplifier circuit comprising:
   a p-type or n-type thin-film transistor provided on an insulating surface,
   wherein said thin-film transistor comprises:
      source and drain electrodes;
      a semiconductor film provided on said insulating surface and having an outward radial direction of crystal growth from one of the source and drain electrodes to a region near to the other of the source and drain electrodes; and
      a gate electrode,
      wherein said gate electrode surrounds said one of the source and drain electrodes, and the other of the source and drain electrodes surrounds said gate electrode, and
      wherein said outward radial direction of crystal growth is substantially parallel with said insulating surface.

2. The circuit of claim 1 wherein said gate electrode and said source and drain electrodes are provided concentrically.

3. The circuit of claim 1 wherein the other of the source and drain electrodes, has a cut.

4. The circuit of claim 3 wherein said cut of the other of the source and drain electrodes is provided at extensions of said gate electrode and said one of the source and drain electrodes which extends toward outside of the other of the source and drain electrodes therefrom.

5. A differential amplifier circuit comprising:
a p-type or n-type thin-film transistor provided on an insulating surface,
wherein said thin-film transistor comprises:
source and drain electrodes;
a semiconductor film provided on said insulating surface and having an inward radial direction of crystal growth from a region near to one of the source and drain electrodes to the other of the source and drain electrodes; and
a gate electrode,
wherein said gate electrode surrounds the other of the source and drain electrodes, and said one of the source and drain electrodes surrounds said gate electrode, and
wherein said inward radial direction of crystal growth is substantially parallel with said insulating surface.

6. The circuit of claim 5 wherein said region near to one of the source and drain electrodes is a ring-shaped region.

7. The circuit of claim 5 wherein said one of the source and drain electrodes has a cut.

8. The circuit of claim 7 wherein said cut of said one of the source and drain electrodes is provided at extensions of said gate electrode and the other of the source and drain electrodes which extends toward outside of said one of the source and drain electrodes therefrom.

9. An analog buffer comprising:
a p-type or n-type thin-film transistor provided on an insulating surface,
wherein said thin-film transistor comprises:
source and drain electrodes;
a semiconductor film provided on said insulating surface and having an outward radial direction of crystal growth from one of the source and drain electrodes, to a region near to the other of the source and drain electrodes; and
a gate electrode,
wherein said gate electrode surrounds said one of the source and drain electrodes, and the other of the source and drain electrodes surrounds said gate electrode, and
wherein said outward radial direction of crystal growth is substantially parallel with said insulating surface.

10. The analog buffer of claim 9 wherein said gate electrode and said source and drain electrodes are provided concentrically.

11. The analog buffer of claim 9 wherein the other of the source and drain electrodes has a cut.

12. The analog buffer of claim 11 wherein said cut of the other of the source and drain electrodes is provided at extensions of said gate electrode and said one of the source and drain electrodes which extends toward outside of the other of the source and drain electrodes therefrom.

13. An analog buffer comprising:
a p-type or n-type thin-film transistor provided on an insulating surface,
wherein said thin-film transistor comprises:
source and drain electrodes;
a semiconductor film provided on said insulating surface and having an inward radial direction of crystal growth from a region near to one of the source and drain electrodes to the other of the source and drain electrodes; and
a gate electrode,
wherein said gate electrode surrounds the other of the source and drain electrodes, and said one of the source and drain electrodes surrounds said gate electrode, and
wherein said inward radial direction of crystal growth is substantially parallel with said insulating surface.

14. The analog buffer of claim 13 wherein said region near to one of the source and drain electrodes, is a ring-shaped region.

15. The analog buffer of claim 13 wherein said one of the source and drain electrodes has a cut.

16. The analog buffer of claim 15 wherein said cut of said one of the source and drain electrodes is provided at extensions of said gate electrode and the other of the source and drain electrodes which extends toward outside of said one of the source and drain electrodes therefrom.

17. An electro-optical device comprising:
a pair of thin-film transistors having one of p-type and n-type provided on an insulating surface,
wherein each of said thin-film transistors comprises:
source and drain electrodes;
a semiconductor film provided on said insulating surface and having an outward radial direction of crystal growth from one of the source and drain electrodes to a region near to the other of the source and drain electrodes; and
a gate electrode,
wherein said gate electrode surrounds said one of the source and drain electrodes, and the other of the source and drain electrodes surrounds said gate electrode in at least one of said thin-film transistors, and
wherein said outward radial direction of crystal growth is substantially parallel with said insulating surface, and
wherein said thin-film transistors are patterned adjacent to each other.

18. The device of claim 17 wherein said gate electrode and said source and drain electrodes are provided concentrically.

19. The device of claim 17 wherein the other of the source and drain electrodes has a cut.

20. The device of claim 19 wherein said cut of the other of the source and drain electrodes is provided at extensions of said gate electrode and said one of the source and drain electrodes which extends toward outside of the other of the source and drain electrodes therefrom.

21. An electro-optical device comprising:
a pair of thin-film transistors having one of p-type and n-type provided on an insulating surface,
wherein each of said thin-film transistors comprises:
source and drain electrodes;
a semiconductor film provided on said insulating surface and having an inward radial direction of crystal growth from a region near to one of the source and drain electrodes to the other of the source and drain electrodes; and
a gate electrode,
wherein said gate electrode surrounds the other of the source and drain electrodes, and said one of the source and drain electrodes surrounds said gate electrode in at least one of said thin-film transistors,
wherein said inward radial direction of crystal growth is substantially parallel with said insulating surface, and
wherein said thin-film transistors are patterned adjacent to each other.

22. The device of claim 21 wherein said region near to one of the source and drain electrodes is a ring-shaped region.

23. The device of claim 21 wherein said one of the source and drain electrodes has a cut.

24. The device of claim 23 wherein said cut of said one of the source and drain electrodes is provided at extensions of said gate electrode and the other of the source and drain electrodes which extends toward outside of said one of the source and drain electrodes therefrom.

25. An electro-optical device comprising:

a thin-film transistor provided on an insulating surface, wherein said thin-film transistor comprises:

source and drain electrodes;

a semiconductor film provided on said insulating surface and having an outward radial direction of crystal growth from one of the source and drain electrodes to a region near to the other of the source and drain electrodes;

a gate electrode; and a pixel electrode connected with said one of the source and drain electrodes, wherein said gate electrode surrounds said one of the source and drain electrodes, and the other of the source and drain electrodes surrounds said gate electrode, and wherein said outward radial direction of crystal growth is substantially parallel with said insulating surface.

26. The device of claim 25 wherein said gate electrode and said source and drain electrodes are provided concentrically.

27. The device of claim 25 wherein the other of the source and drain electrodes has a cut.

28. The device of claim 27 wherein said cut of the other of the source and drain electrodes is provided at extensions of said gate electrode and said one of the source and drain electrodes which extends toward outside of the other of the source and drain electrodes therefrom.

29. An electro-optical device comprising:

a thin-film transistor provided on an insulating surface, wherein said thin-film transistor comprises:

source and drain electrodes;

a semiconductor film provided on said insulating surface and having an inward radial direction of crystal growth from a region near to one of the source and drain electrodes to the other of the source and drain electrodes;

a gate electrode; and a pixel electrode connected with the other of the source and drain electrodes, wherein said gate electrode surrounds the other of the source and drain electrodes, and said one of the source and drain electrodes surrounds said gate electrode, and wherein said inward radial direction of crystal growth is substantially parallel with said insulating surface.

30. The device of claim 29 wherein said region near to one of the source and drain electrodes is a ring-shaped region.

31. The device of claim 29 wherein said one of the source and drain electrodes has a cut.

32. The device of claim 31 wherein said cut of said one of the source and drain electrodes is provided at extensions of said gate electrode and the other of the source and drain electrodes which extends toward outside of said one of the source and drain electrodes therefrom.

33. An electro-optical device comprising:

a peripheral circuit comprising a thin-film transistor provided on an insulating surface, wherein said thin-film transistor comprises:

source and drain electrodes;

a semiconductor film provided on said insulating surface and having an outward radial direction of crystal growth from one of the source and drain electrodes to a region near to the other of the source and drain electrodes; and a gate electrode, wherein said gate electrode surrounds said one of the source and drain electrodes, and the other of the source and drain electrodes surrounds said gate electrode, and wherein said outward radial direction of crystal growth is substantially parallel with said insulating surface.

34. The device of claim 33 wherein said gate electrode and said source and drain electrodes are provided concentrically.

35. The device of claim 33 wherein the other of the source and drain electrodes has a cut.

36. The device of claim 35 wherein said cut of the other of the source and drain electrodes is provided at extensions of said gate electrode and said one of the source and drain electrodes which extends toward outside of the other of the source and drain electrodes therefrom.

37. An electro-optical device comprising:

a peripheral circuit comprising a thin-film transistor provided on an insulating surface, wherein said thin-film transistor comprises:

source and drain electrodes;

a semiconductor film provided on said insulating surface and having an inward radial direction of crystal growth from a region near to one of the source and drain electrodes to the other of the source and drain electrodes; and a gate electrode, wherein said gate electrode surrounds the other of the source and drain electrodes, and said one of the source and drain electrodes surrounds said gate electrode, and wherein said inward radial direction of crystal growth is substantially parallel with said insulating surface.

38. The device of claim 37 wherein said region near to one of the source and drain electrodes is a ring-shaped region.

39. The device of claim 37 wherein said one of the source and drain electrodes has a cut.

40. The device of claim 39 wherein said cut of said one of the source and drain electrodes is provided at extensions of said gate electrode and the other of the source and drain electrodes which extends toward outside of said one of the source and drain electrodes therefrom.

* * * * *